United States Patent [19]

Williams et al.

[11] Patent Number: 5,896,069

[45] Date of Patent: Apr. 20, 1999

[54] CROSS COUPLED DIFFERENTIAL OSCILLATOR

[75] Inventors: Bertrand J. Williams, Austin, Tex.; Eric N. Mann, Issaquah, Wash.

[73] Assignee: Cypress Semiconductor Corp., San Jose, Calif.

[21] Appl. No.: 08/815,701

[22] Filed: Mar. 12, 1997

Related U.S. Application Data

[63] Continuation of application No. 08/569,683, Dec. 8, 1995, abandoned.

[51] Int. Cl.$^6$ .............................. H03B 5/02; H03K 3/354
[52] U.S. Cl. .................. 331/57; 331/108 A; 331/177 R; 327/270; 327/274
[58] Field of Search ............................. 331/57, 108 A, 331/108 B, 177 R; 327/270, 274

[56] References Cited

U.S. PATENT DOCUMENTS

| | | | |
|---|---|---|---|
| 5,426,398 | 6/1995 | Kuo | 331/57 |
| 5,436,939 | 7/1995 | Co et al. | 375/376 |
| 5,703,541 | 12/1997 | Nakashima | 331/57 |

OTHER PUBLICATIONS

1993 IEEE International Solid-State Circuits Conference—M. Horowitz et al., "TP 10:5: PLL Design for a 500 MB/s Interface", Feb. 1993, pp. 93, 161, 282.

*Primary Examiner*—Siegfried H. Grimm
*Attorney, Agent, or Firm*—Maiorana & Acosta, P.C.

[57] ABSTRACT

A multi-stage apparatus used as a voltage controlled oscillator. Each stage includes a first complementary differential current switch and a second complementary differential current switch with a second set of complementary differential current switches having a first complementary differential current switch and a second complementary differential current switch, the two sets of complementary differential current switches are connected in a push pull arrangement. In this arrangement, the outputs of the first complementary differential current switch of the first set of complementary differential current switches and the first complementary differential current switch of the second set of complementary differential current switches are connected with the input of the second complementary differential current switch of the first set of complementary differential current switches. The outputs of the second complementary differential current switch of the first set of complementary differential current switches and the second complementary differential current switch of the second set of complementary differential current switches are connected with the input of the first complementary differential current switch of the second set of complementary differential current switches. A controlled complementary voltage clamp is connected to the output nodes of the first set of complementary differential current switches and a controlled complementary voltage clamp is connected to the output nodes of the second set of complementary differential current switches.

15 Claims, 2 Drawing Sheets

5,896,069

CROSS COUPLED DIFFERENTIAL OSCILLATOR

This is a continuation of U.S. patent application Ser. No. 08/569,683, filed Dec. 8, 1995 and now abandoned.

BACKGROUND OF THE INVENTION

1. Field of the Invention

The present invention pertains to voltage controlled oscillators and more particularly to voltage controlled ring oscillators that are commonly utilized in phase locked loop control systems.

2. Related Prior Art

Oscillators may occur in many forms. The simplest form of an oscillator is an amplifier with positive feedback. This oscillator is one which generates a signal where the output voltage oscillates, meaning that it swings up and down in a regular pattern. This signal may be a simple wave, such as a sine wave, square wave, sawtooth wave, etc. or a more complicated waveform.

Prior art in use for voltage controlled oscillators consists of two basic types of circuits, bi-stable multi-vibrators and ring oscillators. Ring oscillators are of importance as relating to the present invention. There are several circuit design techniques for implementing current or voltage controlled ring oscillator designs. A ring oscillator consists of a multiplicity of stages connected in such a manner as to provide an effective phase inversion allowing oscillation. Typically, three stages are used to provide the instability and the positive feedback necessary for oscillation. Less than three stages tend to be stable and do not oscillate freely.

Ring type oscillators may be grouped essentially into two categories based upon the design of individual stages used in the ring. These two categories are conventional CMOS current starved inverters and differential current switch amplifiers. These are the most common types of CMOS ring oscillators.

FIG. 1 is a circuit diagram for a single stage of a differential current switch ring type oscillator. Parallel CMOS circuits 12 and 14 are connected to voltage source 16, $V_{DD}$, through a P channel FET 18. Gate 19 of FET 18 is connected to $P_{BIAS}$, with its source 20 connected to $V_{DD}$ and its drain 22 connected to the sources 24 and 26 of P-type FETs 28 and 30, respectively, of CMOS circuits 12 and 14. $P_{BIAS}$ connects to gates of additional FET's, within other stages of the ring oscillator.

FET 28 has its gate 32 connected to input IN while FET 30 has its gate 34 connected to $\overline{IN}$. Drain 36 of P-type FET 28 is connected to drain 38 of N-type FET 40 of CMOS circuit 12 and drain 42 of P-type FET 30 is connected to drain 44 of N-type FET 46 in CMOS circuit 14. Output OUT is received from the gate 50 and the drain 44 of N-type FET 46. The output $\overline{OUT}$ is taken from the gate 48 and the drain 38 of the FET 40. Sources 52 and 54 of FETs 40 and 46 are connected to voltage source $V_{SS}$.

In operation, the output and inverted output of this first stage is fed as inputs to the next stage. The outputs of this second stage provide the inputs for the next stage etc., until the last stage whose output and inverted output are fed to the input and inverted input of the stage illustrated. This is done in a ring or circular fashion, which gives it its name of a ring type oscillator. A logical inversion must occur within the ring.

It is to be noted that FET's 40 and 46 act as the loads for the differential current switch. While the loads are shown as FET's, any load is sufficient as long as a current and voltage relationship can be established to provide greater than unity gain for the stage.

The differential current switch circuit design type of ring oscillator has the advantage of being relatively both process and power supply voltage insensitive. This circuit, however, provides very small differential output voltages at each stage. Each stage must be buffered with an amplifier arrangement having its own sensitivities, to drive conventional CMOS logic. Simple analysis shows that this circuit may be implemented as either a PMOS or NMOS based switch, each type having its own advantages and disadvantages.

FIG. 2 is a circuit diagram for a single stage of a current starved inverter type ring oscillator. CMOS circuit 52 includes P-type FET 54 and N-type FET 56 connected at the drain 58 of FET 54 and the drain 60 of FET 56. Source 62 of FET 54 is connected to voltage source $V_{DD}$ 64 through P-type FET 66, having its gate 68 connected to $P_{BIAS}$ with its drain 70 connected to source 62 and its source 72 connected to $V_{DD}$ 64. Source 74 of N-type FET 56 is connected to voltage source $V_{SS}$ 76 through N-type FET 78 having its gate 80 connected to $N_{BIAS}$, its drain 82 connected to source 74 and its source 84 connected directly to $V_{SS}$ 76. Input IN is fed to gates 86 and 88 of P-type FET 54 and N-type FET 56 respectively. Output OUT is taken from the connection of drain 58 of FET 54 and drain 60 of FET 56.

Only a first stage is illustrated, with the additional stages being identical, the combination of which forms a ring which provides the ring oscillator. In the operation of the total ring circuit, the output from this first stage provides the input for the next stage of the ring oscillator. The output of the second stage provides the input for the third stage etc., until the last stage whose output adds to the input of the first stage.

The current starved inverter type ring oscillator provides the advantage of a very straightforward interface with conventional CMOS logic circuits, since its internal voltage swing approximates conventional rail to rail CMOS logic. This circuit design, however, is sensitive to power supply voltage and inverter threshold effects as well as the nonidealities of the MOS devices due to process variance.

Both types of ring oscillators described usually incorporate external CMOS stage buffering for improved drive characteristics and load independence.

SUMMARY OF THE INVENTION

The present invention is an enhancement of the performance and power characteristics of CMOS oscillators, specifically in this case a current/voltage controlled ring oscillator. Current or voltage controlled oscillators, usually referred to as VCO's, are commonly utilized in phase locked loop (PLL) control systems. The Voltage controlled oscillator in a phase locked loop system is often a significant source of problems for the phase locked loop designer. The oscillator must be designed to have an operating range, have predictable gain, have low sensitivity to noise from power supply sources and generate precision logically usable outputs. The oscillator of the present invention does all of the above better than prior art solutions.

The ring oscillator of the present invention includes two complementary MOS devices wired in an arrangement similar to two inverters, each sharing an NMOS and PMOS current source arrangement. These two CMOS devices are wired to form two sets of complementary differential current switches. The outputs of the two sets of differential current switches are cross-coupled, being connected to the inputs of one of the sets of switches. A controlled complementary voltage clamp is connected to the output nodes of the current switches. This circuit provides improved immunity to process variation, power supply variation and improved noise insensitivity.

DESCRIPTION OF THE PREFERRED EMBODIMENT

The present invention utilizes the best features of each of the prior art structures described to compensate for odd process corners and temperature extremes and provide convenient interfacing to conventional CMOS logic. This innovation of the present invention accomplishes this by providing differential operation at small voltage swings biased at conventional CMOS inverter thresholds and by using a push-pull current starved differential switch arrangement. This structure is further enhanced by adding cross-coupling which increases the zero differential gain and switching rate and improves the transient noise rejection performance.

Figure 1:
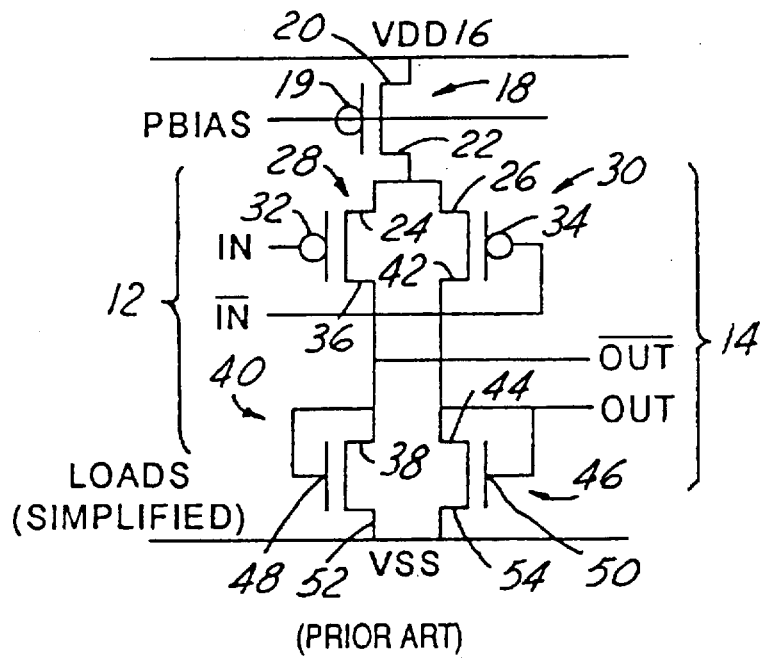
FIG. 1 is a schematic diagram of one stage of a typical differential current switch circuit used in ring oscillators.
Figure 2:
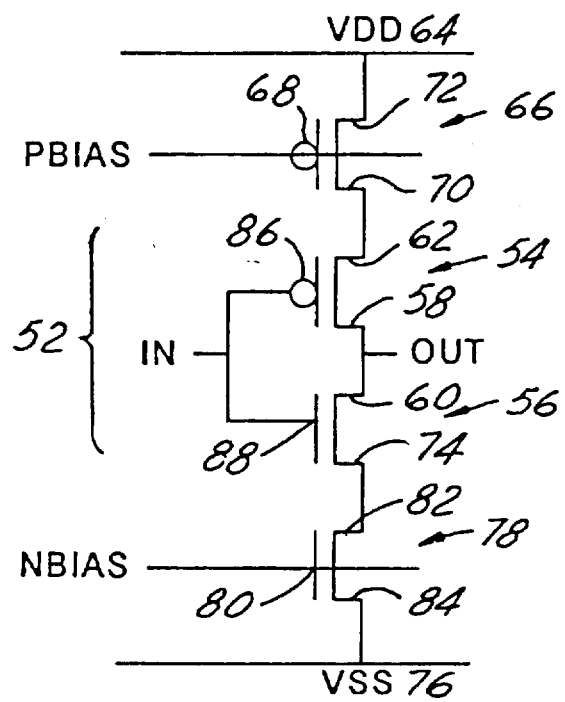
FIG. 2 is a schematic diagram of one stage of a typical current starved inverter circuit used in ring oscillators.
Figure 3:
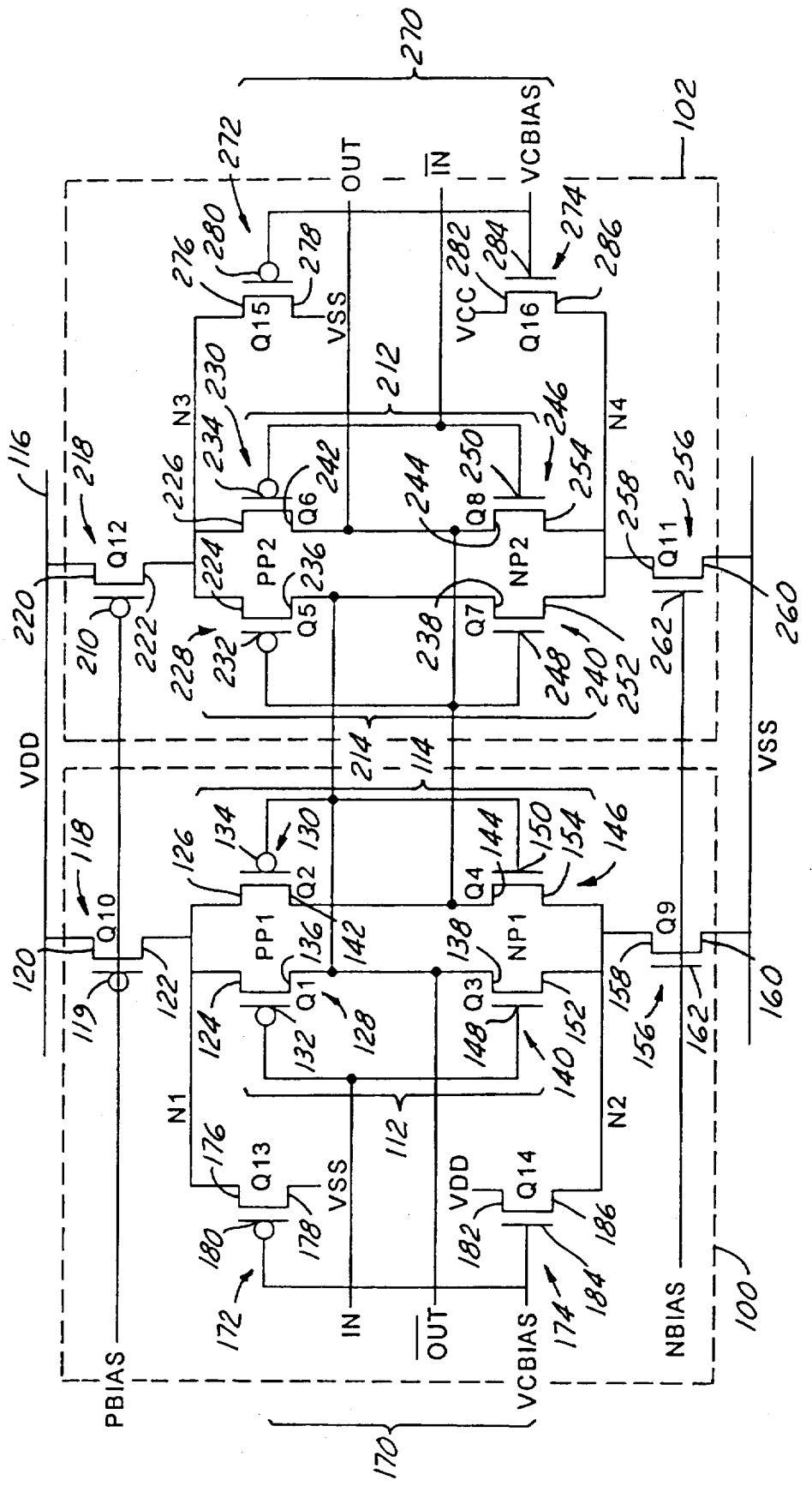
FIG. 3 is a schematic diagram of one stage of a ring oscillator utilizing the present invention.

FIG. 3 illustrates a schematic diagram of an embodiment of the present invention. This stage of the circuit of the present invention has two portions 100 and 102. For simplicity sake, The similar portions of the circuits will differ in number by one hundred.

Portion 100 contains parallel CMOS circuits 112 and 114, connected to voltage source 116, $V_{DD}$, through a P channel FET 118. Gate 119 of FET 118 is connected to $P_{BIAS}$, with its source 120 connected to $V_{DD}$ and its drain 122 connected to the sources 124 and 126 of P-type FETs 128 and 130, respectively, of CMOS circuits 112 and 114. Both FET 128 and FET 140 have their gates, 132 and 148, respectively, connected to input IN. Drain 136 of P-type FET 128 is connected to drain 138 of N-type FET 140 of CMOS circuit 112 and drain 142 of P-type FET 130 is connected to drain 144 of N-type FET 146 in CMOS circuit 114. Output $\overline{OUT}$ is taken from drain 138 and drain 136. Sources 152 and 154 of FETs 140 and 146 are connected to voltage source $V_{SS}$ through FET 156, being connected to its drain 158. Source 160 of FET 156 is connected directly to $V_{SS}$ and its gate 162 is connected to $N_{BIAS}$.

CMOS circuit 112 with FET 128 and FET 140 and CMOS circuit 114 with FET 130 and FET 146 form two sets of complementary differential current switches.

Connected across CMOS circuits 112 and 114 is CMOS circuit 170, having P-type FET 172 and N-type FET 174. Source 176 of FET 172 is connected to drain 122 of FET 118, with its drain 178 being connected to $V_{SS}$ and its gate 180 being connected to voltage source $V_{CBIAS}$. Drain 182 of FET 174 is connected to $V_{DD}$, with its gate 184 being connected to voltage source $V_{CBIAS}$ and its drain 186 connected to source 160 of FET 156.

FET 172 and FET 174 form a controlled complementary voltage clamp connected to the current source nodes of the current starved inverter/differential current switch arrangement of the present invention to provide threshold centering and controlled voltage swing within the stage, independent of power supply variance.

Similarly, cross coupled portion 102 contains parallel CMOS circuits 212 and 214, connected to voltage source 216, $V_{DD}$, through a P channel FET 218. Gate 219 of FET 218 is connected to $P_{BIAS}$, with its source 220 connected to $V_{DD}$ and its drain 222 connected to the sources 224 and 226 of P-type FETs 228 and 230, respectively, of CMOS circuits 212 and 214. Both FET 230 and FET 246 have their gates, 234 and 250, respectively, connected to input IN bar. FET 228 has its gate 232 connected to gate 248 of FET 240. Drain 236 of P-type FET 228 is connected to drain 238 of N-type FET 240 of CMOS circuit 212 and drain 242 of P-type FET 230 is connected to drain 244 of N-type FET 246 in CMOS circuit 214. Output OUT is taken from drain 244 and drain 242. Sources 252 and 254 of FETs 240 and 246 are connected to voltage source $V_{SS}$ through FET 256, being connected to its drain 258. Source 260 of FET 256 is connected directly to $V_{SS}$ and its gate 262 is connected to $N_{BIAS}$.

CMOS circuit with FET 228 and FET 240 and CMOS circuit with FET 230 and FET 246 form two sets of complementary differential current switches as in the description of the first portion of the circuit of the present invention. The outputs of the first set of current switches, FET 128 and FET 140 on one side and the output of the set of current switches composed of FET 228 and FET 240 on the other side are connected to the inputs of one of the sets of complementary differential current switches made up of FET 130 and FET 146. Concurrently, the outputs of a set of current switches, FET 130 and FET 146 on one side and the output of the set of current switches composed of FET 230 and FET 246 on the other side are connected to the inputs of one of the sets of complementary differential current switches made up of FET 228 and FET 240.

Connected across CMOS circuits 212 and 214 is CMOS circuit 270, having P-type FET 272 and N-type FET 274. Source 276 of FET 272 is connected to drain 222 of FET 218, with its drain 278 being connected to $V_{SS}$ and its gate 280 being connected to voltage source $V_{CBIAS}$. Drain 282 of FET 274 is connected to $V_{DD}$, with its gate 284 being connected to voltage source $V_{CBIAS}$ and its drain 286 connected to source 260 of FET 256.

As described in conjunction with portion 100, FET 272 and FET 274 of portion 102 form a controlled complementary voltage clamp connected to the current source nodes of the current starved inverter/differential current switch arrangement of the present invention to provide threshold centering and controlled voltage swing within the stage, independent of power supply variance.

As stated previously, portions 100 and 102 are cross coupled to the stage output for improved switching performance. Drain 136 of FET 128 and drain 236 of FET 228 are connected to gate 134 of FET 130 and gate 150 of FET 146. Drain 144 of FET 146 and drain 244 of FET 246 are connected to gate 232 of FET 228 and gate 248 of FET 240.

The circuit of the present invention takes the current source arrangement from the starved inverter design and adds a push pull differential switch onto these sources. Cross coupling is added to the stage output for improved switching performance. The cross coupling does not introduce hysteresis, but does effectively cause an effective sharpening of the gain curve at zero differential threshold. In addition to this, a clamp circuit arrangement is added to provide threshold centering and controlled voltage swing within the stage, independent of power supply variance. The interaction of control current and clamp biasing provide for improved process variance tolerance.

Since the voltage swing of this circuit design is clamped and controlled around the threshold of a conventional CMOS inverter, buffering is as simple as placing CMOS inverters onto the complementary outputs of the stage. No sophisticated amplifier arrangements are required and perfectly complementary outputs are provided without extra effort.

The present invention provides the advantages of improved performance characterized by improved process insensitivity, improved control of oscillation frequency, improved noise performance and improved interface into CMOS logic structures.

While there has been illustrated and described a particular embodiment of the present invention, it will be appreciated that numerous changes and modifications will occur to those skilled in the art, and it is intended in the appended claims to cover all those changes and modifications which fall within the true spirit and scope of the present invention.

We claim:

1. A multi-stage apparatus used as a voltage controlled oscillator, each stage including:

a first current starved differential switch;

a second current starved differential switch connected to said first current starved differential switch in a push pull arrangement;

circuit means for cross coupling outputs of said first current starved differential switch and said second current starved differential switch; and a controlled complementary voltage clamp connected to current source nodes of said first differential switch and second differential switch.

2. The multi-stage apparatus according to claim 1 wherein said first current starved differential switch and said second current starved differential switch are CMOS devices.

3. The multi-stage apparatus according to claim 1 wherein said controlled complementary voltage clamp is a CMOS device.

4. A multi-stage ring oscillator circuit, each stage including:

two complementary MOS devices wired in an arrangement each sharing an NMOS and PMOS current source arrangement and being wired to form two sets of complementary differential current switches, each differential current switch having an input and an output, said output of one of said sets of switches being connected to said input of another one of said sets of switches and with a controlled complementary voltage clamp connected to said outputs of each of said two sets of complementary differential current switches.

5. A multi-stage apparatus used as a voltage controlled oscillator, each stage including:

a first set of complementary differential current switches having a first complementary differential current switch and a second complementary differential current switch;

a second set of complementary differential current switches having a first complementary differential current switch and a second complementary differential current switch, said second set of complementary differential current switches connected to said first set of complementary differential current switches in a push pull arrangement;

circuit means for connecting outputs of said first complementary differential current switch of said first set of complementary differential current switches and said first complementary differential current switch of said second set of complementary differential current switches with the input of said second complementary differential current switch of said first set of complementary differential current switches;

circuit means for connecting outputs of said second complementary differential current switch of said second set of complementary differential current switches and said second complementary differential current switch of said first set of complementary differential current switches with the input of said first complementary differential current switch of said second set of complementary differential current switches; and a controlled complementary voltage clamp connected to current source nodes of said first set of complementary differential current switches and said second set of complementary differential current switches.

6. The multi-stage apparatus according to claim 5, wherein said first set of complementary differential current switches and second set of complementary differential current switches are CMOS devices.

7. The multi-stage apparatus according to claim 5, wherein said controlled complementary voltage clamp is a CMOS device.

8. A multi-stage apparatus used as a voltage controlled oscillator, each stage including:

a plurality of sets of complementary differential current switches, each set having a first complementary differential current switch and a second complementary differential current switch;

circuit means for cross coupling outputs and inputs of one set of complementary differential current switches and another set of complementary differential current switches; and, controlled complementary clamp means connected to current source nodes of said sets of complementary differential current switches.

9. The multi-stage apparatus according to claim 8, wherein said circuit means includes:

first connection means for connecting outputs of said first complementary differential current switch of one set of complementary differential current switches and said first complementary differential current switch of another set of complementary differential current switches with the input of said second complementary differential current switch of said one set of complementary differential current switches;

second connection means for connecting outputs of said second complementary differential current switch of said one set of complementary differential current switches and said second complementary differential current switch of said other set of complementary differential current switches with the input of said first complementary differential current switch of said other set of complementary differential current switches.

10. The multi-stage apparatus according to claim 8, wherein said controlled complementary clamp means includes:

first voltage clamp means connected to current source nodes of one set of complementary differential current switches; and second voltage clamp means connected to current source nodes of another set of complementary differential current switches.

11. The multi-stage apparatus according to claim 8, wherein said sets of complementary differential current switches are CMOS devices.

12. The multi-stage apparatus according to claim 8, wherein said controlled complementary clamp means includes a CMOS device.

13. A multi-stage apparatus used as a voltage controlled oscillator, each stage including:

a plurality of sets of complementary differential current switches, each set having a first complementary differential current switch and a second complementary differential current switch where outputs of said first complementary differential current switch of one set of complementary differential current switches and said first complementary differential current switch of another set of complementary differential current switches are connected with the input of said second complementary differential current switch of said one set of complementary differential current switches, and outputs of said second complementary differential current switch of said one set of complementary differential current switches and said second complementary differential current switch of said other set of complementary differential current switches are connected with the input of said first complementary differential current switch of said other set of complementary differential current switches; and, controlled complementary clamp means connected to current source nodes of said sets of complementary differential current switches.

14. The multi-stage apparatus according to claim 13, wherein said sets of complementary differential current switches are CMOS devices.

15. The multi-stage apparatus according to claim 13, wherein said controlled complementary clamp means includes a CMOS device.

* * * * *